(12) United States Patent
Nitschke

(10) Patent No.: US 7,795,817 B2
(45) Date of Patent: Sep. 14, 2010

(54) CONTROLLED PLASMA POWER SUPPLY

(75) Inventor: Moritz Nitschke, Freiburg (DE)

(73) Assignee: HUETTINGER Elektronik GmbH + Co. KG, Freiburg (DE)

( * ) Notice: Subject to any disclaimer, the term of this patent is extended or adjusted under 35 U.S.C. 154(b) by 355 days.

(21) Appl. No.: 11/944,179

(22) Filed: Nov. 21, 2007

(65) Prior Publication Data

US 2008/0122369 A1 May 29, 2008

Related U.S. Application Data

(60) Provisional application No. 60/867,159, filed on Nov. 24, 2006.

(51) Int. Cl.
H01J 7/24 (2006.01)

(52) U.S. Cl. .............. 315/111.21; 315/111.31; 315/111.51; 315/349

(58) Field of Classification Search ............ 315/111.21, 315/326, 349, 111.31, 111.51; 219/121.11, 219/121.15, 121.23, 121.32–121.36, 121.59
See application file for complete search history.

(56) References Cited

U.S. PATENT DOCUMENTS

| 4,031,464 A | 6/1977 | Norberg |
| 4,396,478 A | 8/1983 | Aizenshtein et al. |
| 4,588,952 A | 5/1986 | Matsuoka |
| 4,625,283 A | 11/1986 | Hurley |
| 4,694,402 A | 9/1987 | McEachern et al. |
| 4,936,960 A | 6/1990 | Siefkes et al. |
| 5,192,894 A | 3/1993 | Teschner |
| 5,241,152 A | 8/1993 | Anderson et al. |
| 5,543,689 A * | 8/1996 | Ohta et al. ............ 315/111.21 |
| 5,576,939 A * | 11/1996 | Drummond ................ 363/16 |
| 5,611,899 A | 3/1997 | Maass |
| 5,698,082 A | 12/1997 | Teschner et al. |
| 5,718,813 A | 2/1998 | Drummond et al. |
| 5,729,145 A | 3/1998 | Blades |
| 5,804,975 A | 9/1998 | Alers et al. |
| 5,889,391 A * | 3/1999 | Coleman ................... 323/271 |
| 5,993,615 A | 11/1999 | Abry et al. |
| 6,007,879 A | 12/1999 | Scholl |

(Continued)

FOREIGN PATENT DOCUMENTS

DE 4127504 2/1993

(Continued)

OTHER PUBLICATIONS

Ochs et al., "Advanced Power Supplies designed for Plasma Deposition and Etching", Vakuum in Forschung und Praxis, vol. 8, No. 5, Sep. 26, 2006, pp. 32-36.

(Continued)

Primary Examiner—Douglas W Owens
Assistant Examiner—Tung X Le
(74) Attorney, Agent, or Firm—Fish & Richardson P.C.

(57) ABSTRACT

A plasma power supply system for producing electrical power in the range between 1 kW and 100 kW for a plasma processing system and supplying the power to a plasma chamber through a power line connection, the plasma power supply system includes a power converter, a monitoring section, an arc diverter, a control section with an arc diverter control section and an arc detection section, and an input device wherein the input device is connected to the arc diverter.

37 Claims, 7 Drawing Sheets

U.S. PATENT DOCUMENTS

| | | | | |
|---|---|---|---|---|
| 6,063,245 | A | 5/2000 | Frach et al. | |
| 6,162,332 | A | 12/2000 | Chiu | |
| 6,213,050 | B1* | 4/2001 | Liu et al. | 118/723 IR |
| 6,332,961 | B1 | 12/2001 | Johnson et al. | |
| 6,416,638 | B1 | 7/2002 | Kuriyama et al. | |
| 6,420,863 | B1 | 7/2002 | Milde et al. | |
| 6,472,822 | B1* | 10/2002 | Chen et al. | 315/111.21 |
| 6,535,785 | B2 | 3/2003 | Johnson et al. | |
| 6,545,420 | B1* | 4/2003 | Collins et al. | 315/111.51 |
| 6,621,674 | B1 | 9/2003 | Zahringer et al. | |
| 6,736,944 | B2 | 5/2004 | Buda | |
| 6,740,207 | B2 | 5/2004 | Kloeppel et al. | |
| 6,753,499 | B1 | 6/2004 | Yasaka et al. | |
| 6,783,795 | B2 | 8/2004 | Inoue et al. | |
| 6,859,042 | B2 | 2/2005 | Parker | |
| 6,878,248 | B2 | 4/2005 | Signer et al. | |
| 6,943,317 | B1 | 9/2005 | Ilic et al. | |
| 6,967,305 | B2 | 11/2005 | Sellers | |
| 7,016,172 | B2 | 3/2006 | Escoda | |
| 7,081,598 | B2 | 7/2006 | Ilic et al. | |
| 7,262,606 | B2 | 8/2007 | Axenbeck et al. | |
| 7,301,286 | B2 | 11/2007 | Kuriyama | |
| 7,408,750 | B2 | 8/2008 | Pellon et al. | |
| 2004/0031699 | A1 | 2/2004 | Shoji | |
| 2004/0182697 | A1 | 9/2004 | Buda | |
| 2004/0212312 | A1* | 10/2004 | Chistyakov | 315/111.21 |
| 2005/0051270 | A1 | 3/2005 | Sasaki et al. | |
| 2005/0093459 | A1 | 5/2005 | Kishinevsky | |
| 2005/0135025 | A1 | 6/2005 | Escoda | |
| 2006/0011473 | A1 | 1/2006 | Kuriyama et al. | |
| 2006/0054601 | A1* | 3/2006 | Ilic et al. | 219/121.59 |
| 2006/0100824 | A1 | 5/2006 | Moriya | |
| 2006/0181816 | A1 | 8/2006 | Pellon et al. | |
| 2006/0213761 | A1 | 9/2006 | Axenbeck et al. | |
| 2007/0073498 | A1 | 3/2007 | Winterhalter et al. | |
| 2007/0121267 | A1 | 5/2007 | Kotani et al. | |
| 2007/0168143 | A1 | 7/2007 | Axenbeck et al. | |
| 2007/0251813 | A1 | 11/2007 | Ilic et al. | |
| 2008/0121517 | A1 | 5/2008 | Nitschke | |
| 2008/0121625 | A1 | 5/2008 | Zaehringer | |
| 2008/0133154 | A1* | 6/2008 | Krauss | 702/58 |
| 2008/0216745 | A1 | 9/2008 | Wiedemuth et al. | |
| 2008/0218923 | A1 | 9/2008 | Wiedemuth | |
| 2008/0257869 | A1 | 10/2008 | Nitschke et al. | |

FOREIGN PATENT DOCUMENTS

| | | |
|---|---|---|
| DE | 43 26 100 | 2/1995 |
| DE | 44 20 951 | 12/1995 |
| DE | 19651615 | 7/1997 |
| DE | 19849636 | 5/2000 |
| DE | 10034895 | 2/2002 |
| DE | 10119058 | 10/2002 |
| DE | 102004015090 | 11/2005 |
| DE | 102006002333 | 7/2007 |
| EP | 0713242 | 5/1996 |
| EP | 0 967 697 | 12/1999 |
| EP | 0 692 138 | 1/2004 |
| EP | 1 441 576 | 7/2004 |
| EP | 1705687 | 9/2006 |
| EP | 1720195 | 11/2006 |
| JP | 06132095 | 5/1994 |
| JP | 08-167500 | 6/1996 |
| JP | 08222398 | 8/1996 |
| JP | 09170079 | 6/1997 |
| JP | 2000117146 | 4/2000 |
| JP | 2005077248 | 3/2005 |
| WO | WO 94/25977 | 11/1994 |
| WO | WO 01/13402 | 2/2001 |
| WO | WO 03/037047 | 5/2003 |
| WO | WO 03/088445 | 10/2003 |
| WO | WO 2006/014212 | 2/2006 |
| WO | WO2006116445 | 11/2006 |

OTHER PUBLICATIONS

Van Zyl et al., "Managing Arcs in RF Powered Plasma Processes", Society of Vacuum Coaters, 48th Annual Technical Conference Proceedings, 2005, pp. 44-49.

Zlatanovic et al., "Glow-to-Arc Transition Instability Sensor in Processing Plasma", Proc. 20th International Conference on Microelectronics, vol. 2, Sep. 12-14, 1995, pp. 597-600.

Translation of Office Action from correspondence Japanese Application No. 2007-504279, dated Sep. 28, 2009, 4 pages.

* cited by examiner

CONTROLLED PLASMA POWER SUPPLY

CROSS-REFERENCE TO RELATED APPLICATION(S)

This application claims the benefit of priority under 35 U.S.C. §119(e) from U.S. Application No. 60/687,159, filed on Nov. 24, 2006 and entitled "PLASMA REMOTE ARC CONTROL," which is hereby incorporated by reference in its entirety.

TECHNICAL FIELD

The description relates to plasma processing systems and power supply systems for such plasma-processing or coating devices, in which electric arcs or arcing can occur, for example, between electrodes of a plasma chamber in which the plasma processing or coating takes place.

BACKGROUND

Plasma processing systems are suitable for a number of potential applications and are employed, for instance, for target sputtering. Typically, plasma processing systems produce an electrical power ranging from roughly a few kW up to more than 100 kW. In typical cases, the operating voltage applied to the electrodes or electrode of the plasma chamber is in the range of about 400 to more than 1000 V. Variations in the upward or downward direction, also as a function of the respective application, are possible.

SUMMARY

During plasma processing, arcs can be induced within a plasma and thereby affect the plasma processing. The knowledge about the existence of an arc in the plasma can be used to extinguished the arc by, for example, reducing the amount of energy supplied to the plasma.

However, it is difficult to detect the arc within a power supply system and to anticipate how long the energy supply to the plasma needs to be reduced and when the arc has vanished. If the energy is reduced for a period that is too short, the arc is not extinguished and when the power supply system subsequently tries to deliver power into the plasma processing system, it powers the arc and causes unwanted damages. If the reduced period is too long, the average power into the plasma processing system can decrease too much, which is also undesirable. Moreover, a too long extending reduction of the supplied power can increase a demand for a voltage level for re-ignition of the plasma, and thus can cause coatings used within the plasma processing system to become uneven.

Because arcs behave unpredictably, it is difficult to track an arc by monitoring current or voltage when supplying power to the plasma processing supply system. Additionally, the power line connection between a power supply system and a plasma chamber of the plasma processing system can produce inductances and capacitances that depend on the length of the power line connection between the power supply system and the plasma chamber. Thus, an uncontrolled time delay can accompany the detection of arcs.

In this disclosure, power supply systems and methods for supplying power to a plasma process are described in which the power supply system can be controlled through an input device. Specifically, the input device can be used to provide information about arc activity to the power supply system. Such information can be measured with, for example, a sensor device located close to or within the plasma chamber. Thereby, one can directly control a reaction of the power supply system according to the characteristics of a detected arc.

For example, one can reduce the energy that is supplied to the plasma during a time period that is adapted to the actual presence of the arc in the plasma chamber. The power delivered into the plasma can be inhibited or reset based on an input signal that is supplied to the input device to control an arc diverter directly or via an arc diverter control section.

In general, in a first aspect, a plasma power supply system produces electrical power in the range between 1 kW and 100 kW for a plasma processing system and supplies the power to a plasma chamber through a power line connection. The plasma power supply system includes a power converter, a monitoring section, an arc diverter, a control section with an arc diverter control section, an arc detection section, and an input device, which is connected to the arc diverter.

In another aspect, a plasma processing system includes a plasma chamber for containing an object to be processed and a power supply system that delivers power to the plasma chamber. The power supply system includes a power converter that converts power for delivery to the plasma chamber, an arc diverter coupling the power converter to the plasma chamber, the arc diverter operable through an arc diverter control line to inhibit flow of energy from the power converter into the plasma chamber, and an arc diverter control input device accessible from outside the power supply system and in electrical communication with the arc diverter control line, enabling the arc diverter to be controlled from outside the power supply system.

In another aspect, power is supplied to a plasma processing chamber using a method. The method includes converting mains power to power conditioned to power a plasma process, monitoring the converted power, generating a monitor signal indicative of the monitored converted power, determining whether the generated signal indicates an occurrence of an arc within the plasma chamber, receiving a remote input signal from external to the power supply system indicative of an occurrence of an arc within the plasma chamber, inhibiting flow of converted energy from the power supply system to the plasma chamber in response to the remote input signal, and inhibiting flow of converted energy from the power supply system to the plasma chamber in response to determining that the generated monitor signal indicates an arc occurrence.

In another aspect, a method of fast arc detection in a plasma processing system includes providing a flow of energy out of a power supply system into a plasma chamber by transmitting a power signal from the power supply system to the plasma chamber, receiving an arc detection signal that is generated independently from the power signal, and inhibiting flow of energy from the power supply system and to the plasma chamber if the received arc detection signal indicates an occurrence of an arc.

Implementations can include one or more of the following features. The input device can be directly connected to the arc diverter or it can be connected to the arc diverter through a connection with the arc diverter control section.

The input device can be a digital or an analog input. The input device can be compatible to a cordless transmission system. The input device can be connected to a sensor device, which is remote from the plasma power supply system.

The input device can be configured to determine a length of an input pulse received by the input device and to output a signal with the same or corresponding length to the arc diverter. The input device can be configured to detect a wave shape of a signal received by the input device and to control the arc diverter to produce a pulse wave shape at the output of the power supply system which is proportional or corresponds to the signal at the input device.

The input device can include an IN/OUT connection, which has an input and output.

The arc diverter control section can be configured to receive a first signal from the input device and a second signal from the arc detection section, and the arc diverter control section can be configured to generate a signal to drive the arc diverter by combining the first and second signals according to one or more operations including a NOR, a NAND, a Set/Reset, an OR, an AND, and an EXOR operation.

The arc diverter control section can be configured to activate an arc diverter control signal with a configurable time delay after one of the operations has changed to true. The arc diverter control section can be configured to deactivate an arc diverter control signal with a configurable time delay after one of the operations has changed to false.

The arc diverter control input device can be in electrical communication with the arc diverter, specifically it can be in electrical communication with a control of the arc diverter.

The arc diverter control input device can be coupled to an arc sensor at the plasma chamber.

The arc sensor can be remote from the power supply system.

The arc diverter control input device can include a switch.

The power supply system can include a power converter output monitor that monitors characteristics of the converted power and generates a signal based on the monitored characteristics and an arc diverter controller that controls the arc diverter in response to the signal from the monitor.

The arc diverter controller can be configured to control the arc diverter to inhibit power to the plasma chamber independently of any input through the arc diverter control input device.

The plasma processing system can include an interface associated with the arc diverter controller to enable control of parameters associated with arc detection at the power converter output monitor. The plasma processing system can include an arc detection section within the power supply system.

The arc diverter control input device can be a digital interface input connector.

The arc diverter control input device is configured to receive an analog control input.

The arc diverter can be configured to generate an active signal of a duration proportional to a signal from the arc diverter control input device.

The power supply system can include a housing enclosing the power converter and the arc diverter, and wherein the arc diverter control input device is mounted on an exterior surface of the power supply system housing.

Inhibiting the flow of converted energy from the power supply system can include inhibiting independently of the generated monitor signal.

In some embodiments, the remote input signal can be received from a sensor located at the plasma chamber, wherein the sensor measures an event at the plasma chamber, or it can be received from a user.

Inhibiting the flow of converted energy to the plasma chamber can include receiving the remote input signal and determining whether an arc occurred based on the remote input signal.

In some embodiments, a flow of energy from the power supply system to the plasma chamber can be inhibited if the power signal indicates an arc occurrence.

Receiving the arc detection signal can include receiving an arc diverter control input signal from a location outside of the power supply system.

Receiving the arc diverter control input signal can include receiving the arc diverter control input signal from a sensor located at the plasma chamber, wherein the sensor measures an event at the plasma chamber.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
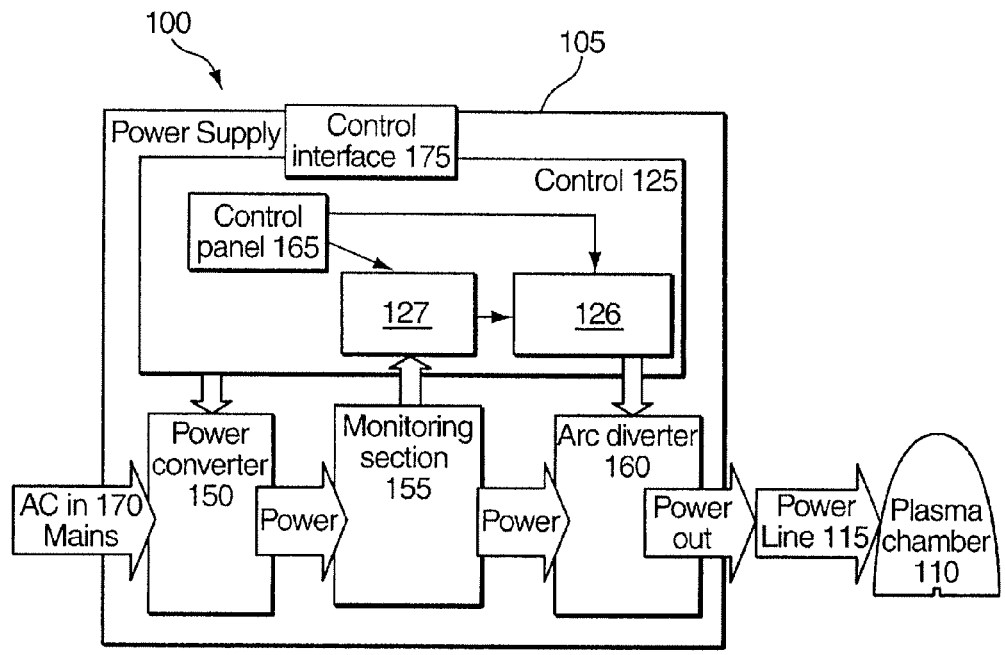
FIG. 1 is a block diagram of a first example of plasma processing system.

Referring to FIG. 1, a plasma processing system 100 includes at least one power supply system 105 that includes a control section 125, a power converter 150, a monitoring section 155, and an arc diverter 160. The control section 125 includes an arc diverter control section 126 connected to the arc diverter 160 and an arc detection section 127 connected to the monitoring section 155 and to the arc diverter control section 126 The power supply system 105 supplies power to a plasma chamber 110 through a power line connection 115.

The power converter 150 converts an AC input 170 into a signal that might be DC, middle frequency (for example, about 10 kHz to about 500 kHz), or high frequency (for example, about 3 MHz to about 100 MHz). The monitoring section 155 monitors or measures voltage, current, and/or power of the signal from the power converter 150, and sends the measured values to the control section 125.

The arc diverter 160 has the function to react on an arc diverter control signal from the arc diverter control section 126 by inhibiting power delivery into the plasma within the plasma chamber 110 after the arc diverter control signal becomes active. The arc diverter 160 can be, in some cases, a shunting switch that closes or a series switch that opens in the case of an active arc control signal. The arc diverter 160 acts as long as the arc diverter control signal from the arc diverter control section 126 is active. The active time can be a predetermined time that might be user settable.

The power converter 150 can be reactive to the arc diverter control signal so that the power converter 150 switches the power delivery off when the arc diverter control signal becomes active. The power converter 150 can be much slower to react than the arc diverter 160, so for plasma processes in which a low arc energy is wanted, an arc diverter 160 is included.

The control section 125 includes a control panel 165 that is used for user input. The control section 125 also includes a control interface 175 (such as, for example, digital/analog inputs/outputs, RS232, PROFIBUS, etc.) that is used for user automatic control of the power converter 150 or for user input.

The arc detection section 127 compares the measured values of power, current, and voltage, or their dynamic behavior to threshold values. The arc detection section 127 forms as an output an arc detection signal that is then fed into the arc diverter control section 126. The arc detection signal is active while an arc is detected. The arc diverter control section 126 converts the arc detection signal from the arc detection section 127 into an arc diverter control signal, which is sent to the arc diverter 160. Upon receipt of the arc diverter control signal, the arc diverter 160 inhibits (immediately or as fast as possible) the power flow into the plasma chamber 110. The arc diverter control section 126 is a part of the control section 125 and has a connection to the control panel 165 and to control interfaces 175. In this way, some of the parameters of the arc diverter control can be changeable by a user through the interfaces 175 and/or panel 165.

For example, the interface 175 and/or panel 165 can include an input for a user to set a predetermined delay time $T_D$ that can be stored within the control section 125 or within the arc detection section 127. The control section 125 activates the arc diverter control signal after the user settable predetermined delay time $T_D$ after the arc detection signal becomes active. Thus, if the arc extinguishes itself within the time $T_D$ after the arc diverter control signal is activated, then the control section 125 will not activate the arc diverter control signal.

The interface 175 and/or panel 165 can include an input for a user to set a predetermined duration time $T_P$ for which the arc diverter control signal is kept active and the predetermined duration time $T_P$ is stored within the control section 125.

The interface 175 and/or panel 165 can include an input for a user to set a level for the arc diverter control signal. The level works to determine the level of the arc diverter control signal and is preferably set to extinguish the arc as fast as possible (reverse voltage level in DC power supplies for example).

The control interface 175 can include a user controllable pin. The controllable pin is called a PowerON or PowerOFF and it works to shut the power converter 150 on or off. A PowerOFF pin might be used if an arc is detected by the user. However, the reaction time for such a system can be slow and a high amount of energy can run into the arc before the power converter 150 is turned off (and sends no more power). The power converter 150 can be reactivated with a PowerON signal to reignite the plasma, but that process can be slow.

Plasma processing systems such as the system 100 shown in FIG. 1 are suitable for a number of potential applications and are employed, for instance, for target sputtering. Typically, plasma processing systems such as the system 100 produce an electrical power ranging from roughly a few kW up to more than 100 kW. In typical cases, the operating voltage applied to the electrodes or electrode of the plasma chamber is in the range of about 400 to more than 1000 V. Variations in the upward or downward direction—also as a function of the respective application—are possible. For example, in "reactive" sputtering applications, a technique applied, for instance, for the production of oxide or nitride films, or in the application of reactive gases problems occur as a result of disruptive breakdown and/or the formation of insulating layers on the conducting target, with the consequence that parasitic capacitors may be formed. Various passive and active circuits have become known that serve to extinguish electric arcs that have been formed as a result of disruptive breakdown. These circuits inhibit the power delivered to the electrodes for a defined period after an arc is detected. For example, in FIG. 1, current flow I and voltage U from the power converter 150 are measured by the monitoring section 155, which analyzes the signals to determine if an arc occurred within the plasma chamber 110.

In general, power supplies (such as the power supply system 105 of FIG. 1) for plasma processing have their own arc detection that is provided by the usage of one or more of a current measurement and a voltage measurement (by way of the monitoring section 155). In some system, the voltage (or current) from the power converter 150 is measured, and an arc is detected if the measured voltage drops under a certain threshold value $U_{ARC}$. The threshold value could be made a fix or a variable value. In some systems, a change velocity in the voltage (or current) (dV/dt) can be detected.

The arc can be extinguished using a switch (such as the arc diverter 160) to reduce the amount of energy flowing into the plasma chamber 110. The switch can be a shunt switch that is closed or a series switch that is opened, depending on the location and configuration of the switch. In some systems, the switching can be accomplished with a voltage reversal to extinguish the arc especially in DC power supplies.

If an arc is detected at the output of the power converter 150 and the power supply system 105 reacts to extinguish the arc by inhibiting power flow to the plasma chamber 110, it is not always possible to anticipate how long the duration of the pulse of the arc diverter control signal should be. If the pulse is too short, the arc is not extinguished and while the power supply system tries to deliver power into the plasma processing system it powers the arc and causes damages, which should be avoided. If the duration is too long, the average power into the plasma processing system can decrease too much, which is undesirable. Long pulse durations can increase a demand for the voltage level for re-ignition of the plasma, and can cause the coating to become uneven.

Arcs behave in manners that can be unpredictable, thus making it difficult to track an arc by monitoring current or voltage within the power supply system 105. Some power supply systems 105 offer one or several control inputs to enable the user of the power supply system to control the duration of an arc extinguishing pulse, the value of the reversal voltage, and other pulse features. These features can be pre-set for each processing cycle and may not controllable for each individual pulse.

Additionally, the power line connection between the power supply system and the plasma chamber can produce inductances and capacitances that depend on the length of the power line connection between the power supply system and the plasma chamber. The inductances and capacitances can be negligible for relatively slow arc detection, for example, for detection within about several µs. But for arc detection times under about one µs, the inductances and capacitances of the power line connection can cause a serious amount of time delay between the time when the arc begins in the plasma processing system and the time when the arc is detected in the power supply system.

Figure 2:
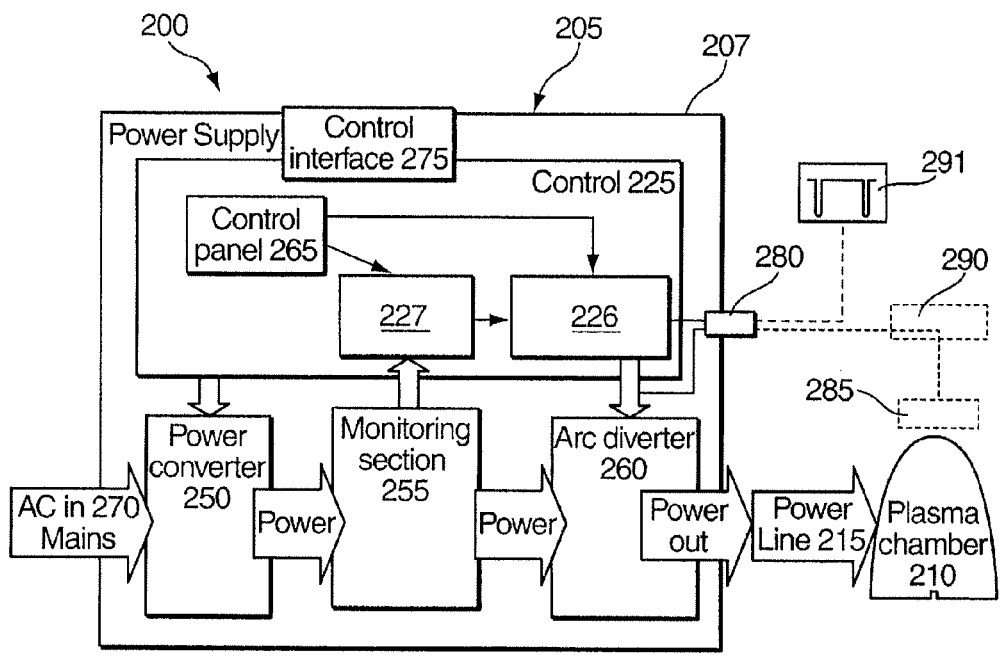
FIG. 2 is a block diagram of a second example of plasma processing system.

Referring to FIG. 2, a plasma processing system 200 includes at least one power supply system 205 that includes a control section 225, a power converter 250, a monitoring section 255, and an arc diverter 260. The control section 225 includes an arc diverter control section 226 connected to the arc diverter 260 and an arc detection section 227 connected to the monitoring section 255 and to the arc diverter control section 226. The power supply system 205 supplies power to a plasma chamber 210 through a power line connection 215. The power supply system 205 includes a control panel 265 and/or a control interface 275 that enables user input of variables and settings associated with the power supply system 205.

The plasma processing system 200 also includes a user controllable input device 280 that is connected directly to the arc diverter control section 226 or directly to the arc diverter control signal from the arc detection section 227 or to both. The user controllable input device 280 is an interface device or interface unit that enables a user to directly control the arc diverter control signal independently of the results of the monitoring section 255 or the output of the arc detection section 227. The input device 280 can be actuated directly by a user. In some examples, the input device 280 includes a switch operable from outside the power supply system. In some cases, the input device 280 is a connector configured to receive an arc diverter control signal from a remote source.

The plasma processing system 200 can include a sensor device 285 at the plasma chamber 210 and being coupled to the input device 280. The sensor device can be remote from the power supply system 205 and it can be connected, for example, over a wireless signal connection. An arc event in the plasma chamber 210 can produce great or small flashes of light at different wavelengths, for example, UV, IR, or visible light. The light flashes can have a long duration (for example, about 100 μs to about 10 ms) or a short duration (for example, about a few ns to several μs). The light flashes can have a fast rising time (for example, about a few ns rise time) or a slow rising time (for example, within several μs). An arc event in the plasma chamber 210 can produce sound waves, for example, bangs or other noises. An arc event in the plasma chamber 210 can cause a disturbance in the electromagnetic signal of the electrodes within the plasma chamber.

The plasma processing system 200 can include a control section 290 connected between the sensor device 285 and the input device 280. Thus, a signal from the sensor device 285 can be sent first to the control section 290, where the signal is examined, compared, computed, etc., and the control section 290 can then send an output signal to the power supply system 205 through the input device 280. For example, if the control section 290 determines that the signal from the sensor device 285 indicates an arc event, the control section 290 can send an alarm signal to the input device 280.

The plasma processing system 200 is able to detect an arc at the beginning, development, or start of the arc and before the energy from the arc has a chance to make a large impact on the plasma processing system. Such a design is useful in semiconductor fabrication system in which arcs should be extinguished to within milliseconds to about microseconds after an arc is detected and the remaining arc energy should be as low as possible, for example, below 1 mJ.

The plasma processing system 200 provides faster arc detection and reduces arc energies by including a power supply system 205 that enables such a detection and arc reduction. The system 200 includes the input device 280 such as an input pin or an input device that is integral with a power supply system 205. The input device 280 provides a user interface. For example, the input device 280 can be electrical, analog or digital, current driven or voltage driven. The input device 280 can include any suitable communication system, including, for example, a digital bus like PROFIBUS, DeviceNet, RS232, RS485, or USB. The input device 280 can include or connect with optical waveguides or optical transmission devices to enable, for example, infrared transmission or radio frequency (RF) transmission.

The input device 280 is used to inhibit the flow of power to an arc in the plasma processing system 200. The input device 280 can be, for example, a light waveguide connector, an electrical connector, or an RF input.

In some implementations, the sensor device 285 can include a light sensitive device that monitors the plasma in the chamber 210. The sensor device 285 detects arcs much earlier than a reasonable voltage drop could be measured or a reasonable current rise could be detected within the power system 205. Thus, the input device 280 and/or the sensor device 285 enable faster arc detection and faster arc interruption.

In some implementations, the sensor device 285 is a light-sensitive device such as a light-sensitive resistor, a light-sensitive diode, or a charge-coupled device (CCD) camera that forms an electrical signal out of a light signal. The electrical signal from the sensor device 285 can be sent directly to the input device 280 of the power supply system 205.

The sensor device 285 can include a light sensitive device that is sensitive to light in the visible spectrum, in ultra-violet spectrum (UV), or in the infrared (IR) spectrum. The sensor device 285 can include a plurality of light sensitive devices, with each device being sensitive to light within a different light spectrum.

The length, the value, the form, and other features of the pulse from the arc diverter control section 226 can be adjusted in order to inhibit the further development of the forming arc.

In other implementations, the light from the sensor device 285 can be sent directly to the power supply system 205 without being converted into an electrical signal. For example, the light from a light sensitive sensor device 285 can be sent directly to the power supply system 205 through waveguides or through air transmission.

The control section 290 can include a user interface such as, for example, a keyboard, a computer mouse, and/or a wheel. The control section 290 can include a register to register values which are then compared with threshold values. Registered values include, for example, the delay time $T_D$, the duration time $T_P$, or the level for the arc diverter control signal. The control section 290 can include a logic arithmetic unit to process digital data. The control section 290 can include a fast analog to digital converter for converting the measured signal at the plasma chamber 210 into digital values and to process them. The control section 290 can include a display to show, for example, a status of the registered values.

The plasma processing system 200 provides for a decrease in the power delivered into an arc at values that are thought to be unreachable.

The plasma processing system 200 can be used for alternating power sources in which it can be difficult to recognize arcs fast enough because voltage and current are changing over time and average levels are used for threshold values.

The sensor device 285 can measure the arc extinguish time well enough so the pulse active time could be driven with preciseness and individually for each arc.

The sensor device 285 can provide a galvanic separation between the plasma chamber 210 and the power supply system 205, for example, if the sensor device 285 includes light waveguides, light transmission, or RF transmission.

The input device 280 can be a digital input in the digital data transmission manner such as CAN, USB, RS232, RS485, PROFIBUS, DeviceNet, LAN, etc. The input device 280 can use any suitable cordless transmission system such as RF transmission (AM, FM, WLAN, Bluetooth, IR, GSM, etc.) as long as the transmission system is fast enough.

In some implementations, the sensor device 285 includes a sonic monitoring device that monitors sonic parameters, such as bangs, noise, or changing of noises, within the plasma chamber 210. The sensor device 285 can use sonic monitoring in addition to other measurements such as optical measurements. The sensor device 285 can use ultrasonic or infrasonic monitoring.

The sensor device 285 can measure electromagnetic waves in the plasma chamber 210 in order to detect arcs.

The sensor device 285 can measure voltage and/or current associated with the electrodes within the plasma chamber 210. Such a direct voltage and/or current measurement within the plasma chamber 210 helps to avoid the delays that are associated with the measuring of voltage or current in the power supply system 205, where such voltage or current can be delayed due to the capacitance and inductance in the power line. The sensor device 285 can include voltage sensors or Langmuir probes in the plasma chamber 210 that monitor charges in the plasma chamber and detect abnormalities long before an arc is fully formed.

As shown, the input device 280 is provided as a separate input to the power supply system 205. However, in some implementations, the input device 280 can be placed at the control panel 265 or at the control interface 275. The input device 280 provides an independent way for a user to actuate the arc diverter control section 226 or to activate the arc diverter 260 to switch off power from the power supply system 205 without having to wait for an arc detection consideration by the arc detection section 227 and monitoring section 255. Thus, the input device 280 provides a direct way for a user to control the extinguishing of an arc in the plasma chamber 210.

The power supply system 205 can include a housing 207 enclosing the power converter, the arc diverter 260, the monitoring section 255, and the control section 225. The input device 280 can be mounted on an exterior surface of the power supply system housing.

If the input device 280 is used in combination with the sensor device 285, then the system can be automated. If the sensor device 285 is coupled to the input device 280, then the input device 280 could include two inputs, one for a user to directly control the arc diverter control signal and one for automatic control as deemed appropriate by the control section 290 (without input from the user). Under automatic control, the control section 290 determines whether an arc is taking place within the plasma chamber 210 based on the signal from the sensor device 285 and sends a signal to the input device 280 or directly to the arc diverter control section 226 to activate the arc diverter 260.

If the arc diverter control signal is activated by automatic control through the control section 290, then the arc diverter control section 226 can be decoupled, as needed, from the arc detection section 227. The input device 280 can include an input for a user to select whether to control the arc diverter control section 226 through the user at the input device 280 or through the arc detection section 227.

In some implementations, the initiation of an arc in the plasma chamber 210 can be detected by the monitoring section 255 in combination with the arc detection section 227 and then the duration of the arc can be detected by the user or by the sensor device 285 through the input device 280. Thus, in these implementations, the beginning of the arc diverter control signal from the arc diverter control section 226 is triggered by the arc detection signal from the arc detection section 227 and the end of the active state of the arc diverter control signal is triggered by the input device 280. Such a design can be useful in situations or application in which the monitoring section 255 is better suited to determining an arc beginning and the user and/or the sensor device 285 is better suited to determining the arc ending.

In some implementations, the initiation of an arc in the plasma chamber 210 can be detected by the user or by the sensor device 285 through the input device 280 and the duration of the arc can be detected by the monitoring section 255 in combination with the arc detection section 227.

In some implementations, arc diverter control section 226 can be configured to only send an arc diverter control signal to the arc diverter 260 if both the input device 280 and the arc detection section 227 indicate an arc is present in the plasma chamber 210.

Figure 3A:
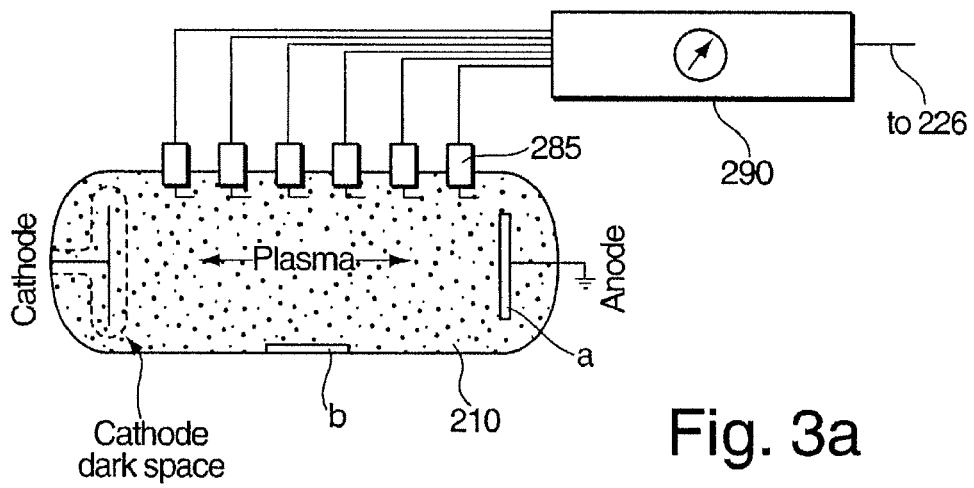
FIG. 3A is a schematic view of a plasma chamber with a sensor device without an arc being present.
Figure 3B:
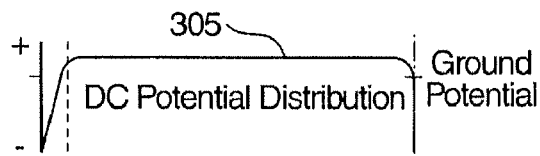
FIG. 3B is a plot illustrating a signal of the sensor device without an arc being present.

Referring to FIGS. 3A and 3B, the plasma chamber 210 is shown with the sensor device 285, which can be coupled to the control section 290 (as shown in FIG. 2) or to the input device 280. In this design, the sensor device 285 includes six measuring devices such as Langmuir probes, and the signal from the sensor device 285 is shown in FIG. 3B. During operation without an occurrence of a fault, the signal distribution 305 from the sensor device 285 appears fairly level.

Figure 4A:
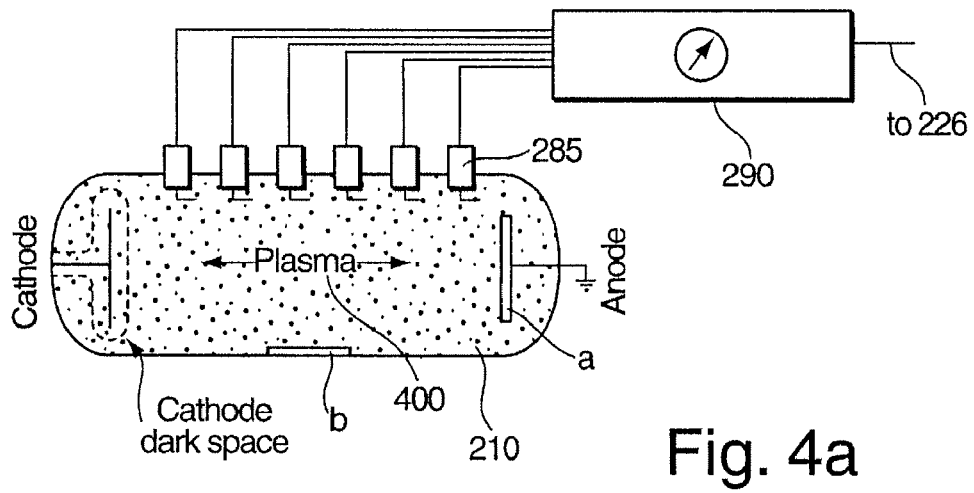
FIG. 4A is a schematic view of the plasma chamber of FIG. 3A with an arc being present.
Figure 4B:
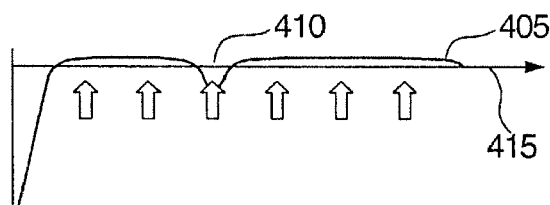
FIG. 4B is a plot illustrating a signal of the sensor device with an are being present.

Referring to FIGS. 4A and 4B, an arc 400 occurs within the plasma chamber 210. The signal distribution 405 from the sensor device 285 displays an event 410 that falls below a threshold value 415.

Figure 5:
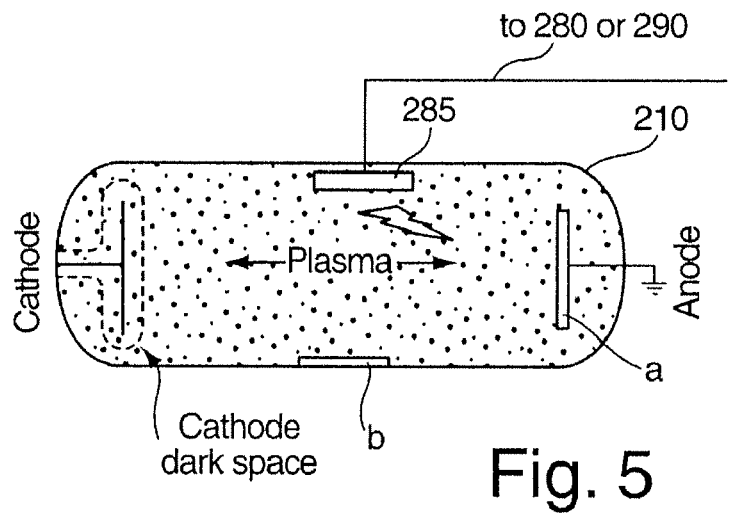
FIG. 5 is a schematic view of a plasma chamber with a light sensitive sensor device with an arc being present.

Referring to FIG. 5, an arc 500 occurs within the plasma chamber 210 and the sensor device 285 is configured as a light sensitive device that detects light emitted from the arc within the plasma chamber 210. The sensor device 285 can be inside the plasma chamber or outside the plasma chamber 210 if the plasma chamber 210 includes a window.

Figure 6:
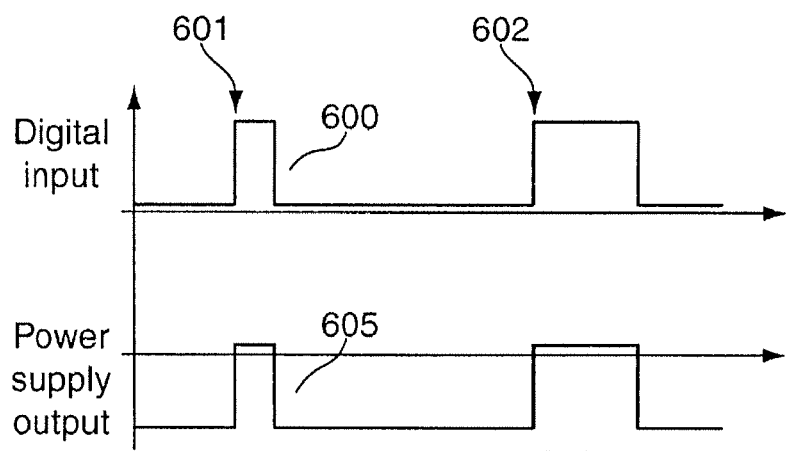
FIG. 6 is a plot illustrating the creation of a power supply system output from a digital input.

Referring to FIG. 6, if the input device 280 is a digital interface input to the power supply system 205, then the length of the input pulse 600 from the input device 280 can be the same as the length of the pulse 605 to the arc diverter 260 and through the power line 215. An arc is detected at time 601, and the input device 280 creates a pulse that indicates the occurrence of the arc and that lasts for the life of the arc. A second arc is detected at time 602, and the input device 280 creates a pulse that indicates the occurrence of the arc and that lasts for the life of the arc. As shown, the second arc has a longer duration than the first arc.

Figure 7:
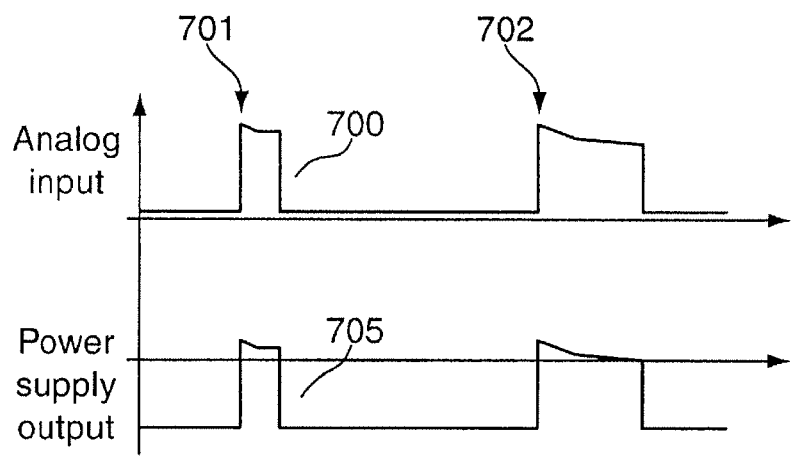
FIG. 7 is a plot illustrating the creation of a power supply system output from an analog input.

Referring to FIG. 7, if the input device 280 is an analog interface input to the power supply system 205, then the length of the input pulse 700 from the input device 280 can be the length of the pulse 705 to the arc diverter 260 and through the power line 215 and the voltage of the input pulse 700 can be proportional to the voltage of the output pulse 705. An arc is detected at time 701, and the input device 280 creates a pulse that indicates the occurrence of the arc and that lasts for the life of the arc. A second arc is detected at time 702, and the input device 280 creates a pulse that indicates the occurrence of the arc and that lasts for the life of the arc. As shown, the second arc has a longer duration than the first arc.

In both cases, the duration time of the arc diverter control signal can be dependent on the life of the individual arc and does not need to be a preset value $T_P$ that is unchangeable. Such a design is possible because the input device 280 can detect the occurrence and extinguishing of an arc more rapidly than the monitoring section 155, which may not be able to determine that an arc is extinguished without having to power the arc In some plasma processing systems it might be helpful to determine a changing behavior of the arc diverter 260 over time to help extinguish an arc more quickly. For example, in DC power supplies, an amount of voltage reversal and a change in the voltage reversal over time of the arc diverter are values that can be determined. In middle frequency or radio frequency power supplies, a transistor can be used as an arc diverter. In some designs, the transistor may not be switched in one step, but rather could be driven first to an ohmic state that depends on the plasma load and second after a short time to a higher ohmic state or completely off. In this case, the input device 280 can be an analog input and the user can determine, for each arc occurrence, the behavior of the arc diverter, the start point, the amount of voltage reversal, or the arc diverter resistance over time in order to extinguish the arc as quickly as possible. The analog input can be the signal 700, as shown in FIG. 7, and the power output in a DC powered plasma processing system can be the signal 705, as shown in FIG. 7.

The input device 280 shown in FIG. 2 is an interface device that can comprise an output feature. An exemplary interface device is an open collector unit, which is an input unit as well as output unit. Such an interface device could provide an input for the arc diverter 260 directly or through arc diverter control section 226 and at the same time provide an output from the arc diverter control section 226. Then it is possible to synchronize several power supply systems with different arc detection behavior or different pulsing behavior. It is also possible to connect a control section with one or several power supply systems. The control section may then receive a signal through the connection line as well as send a signal on the connection line.

Figure 8:
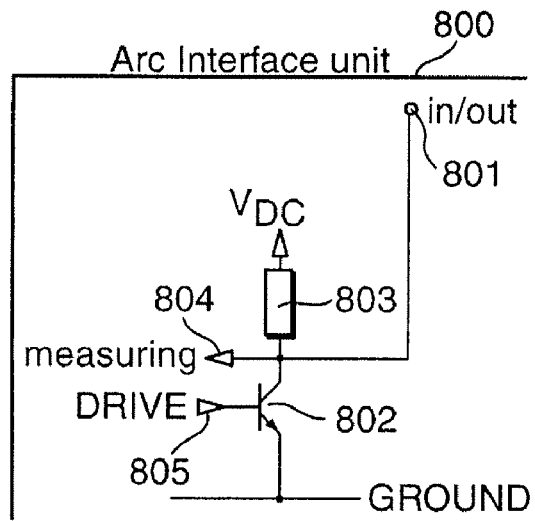
FIG. 8 illustrates an arc interface device.

FIG. 8 shows an arc interface device 800 (also called arc interface unit) with an IN/OUT connection 801, a switching transistor 802, and a resistance 803, which has a relatively high impedance (for example, a value between 1 and 1000 kΩ). The arc interface device 800 holds the voltage potential at the IN/OUT connection 801 and at the measuring point 804 at a level of $V_{DC}$. When the drive signal 805 is active, which could correspond to the detection of an arc, the transistor switches on or goes from a high impedance (much higher than the resistance 803) to a low impedance (much lower than the resistance 803). Then, the voltage potentials at the measuring point 804 and at the IN/OUT connection 801 change from nearly $V_{DC}$ to nearly GROUND level. The same change as induced when the IN/OUT Connection 801 is changed by an external source, for example, by a control section 290 or a second power supply system with the same arc interface unit 800.

Figure 9:
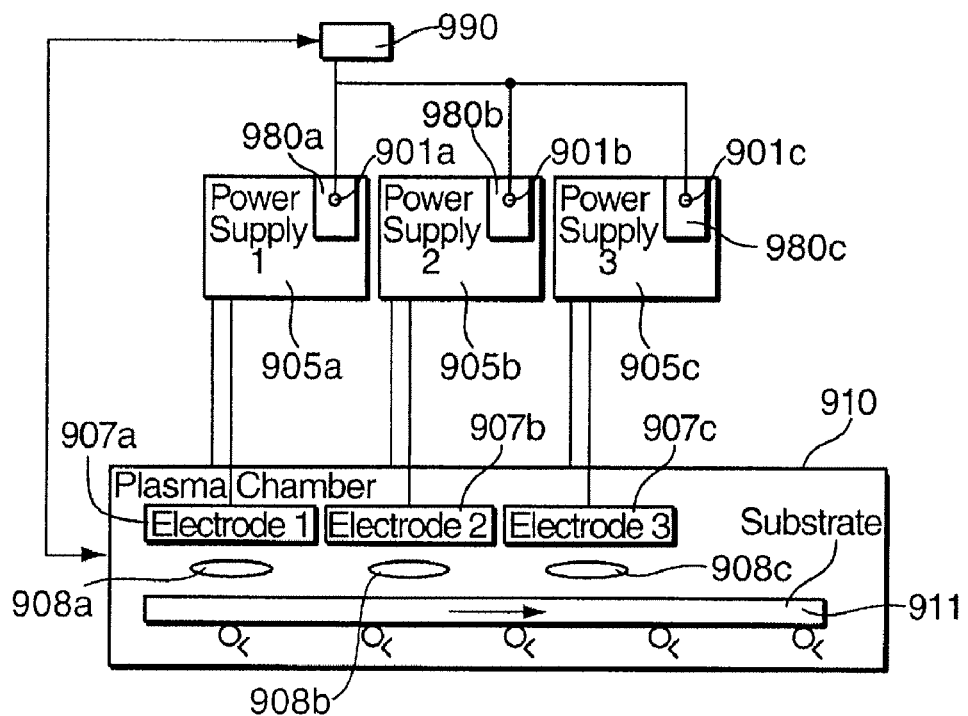
FIG. 9 is a block diagram of a third example of plasma processing system.

FIG. 9 shows a plasma processing system with a plasma chamber 910 through which a substrate 911 is transported. The plasma chamber 910 includes, for example, three electrodes 907a, 907b, 907c, which are powered by three power supply systems 905a, 905b, 905c to generate plasma 908a, 908b, 908c. Each of the power supply systems 905a, 905b, 905c comprises an arc interface unit 980a, 980b, 980c, respectively, which corresponds, for example, to the arc interface unit 800 in FIG. 7, and an IN/OUT connection 901a, 901b, 901c, which corresponds, for example, to the IN/OUT connection 801 in FIG. 7. The IN/OUT-connection 901a, 901b, 901c of the power supply systems 905a, 905b, 905c are connected with each other through a single connection and through another connection to a control device 990 or a source or measuring device. The control device 990 can further control the plasma processing system, for example, the gas flow and the transport velocity of the substrate 911 within the chamber 910.

In another embodiment, the input device 280 can be used to control a pulsing of a power supply system (as shown in FIG. 2). The pulse frequency and/or the length of each pulse can then be controlled by an external source. The external source is, for example, a frequency generator 291 or the control section 290 and can be embedded in the controlling of the plasma process, for example, the gas flow control, the power control of the one or several power supply systems working together or sequentially in the plasma processing system. If the input device 280 is an analog input, the external source 290, 291 may also control the quality or wave shape of the arc diverter as explained above.

In some embodiments, the arc diverter control section 226 is user configurable via control interface 275 or control panel 265. For example, one can configure the reaction of the arc diverter control section 226 on signals sent from the arc detection section 227 and/or the arc interface or input device 280. Exemplary reactions are explained in connection with FIGS. 10A-10D.

Figure 10A:
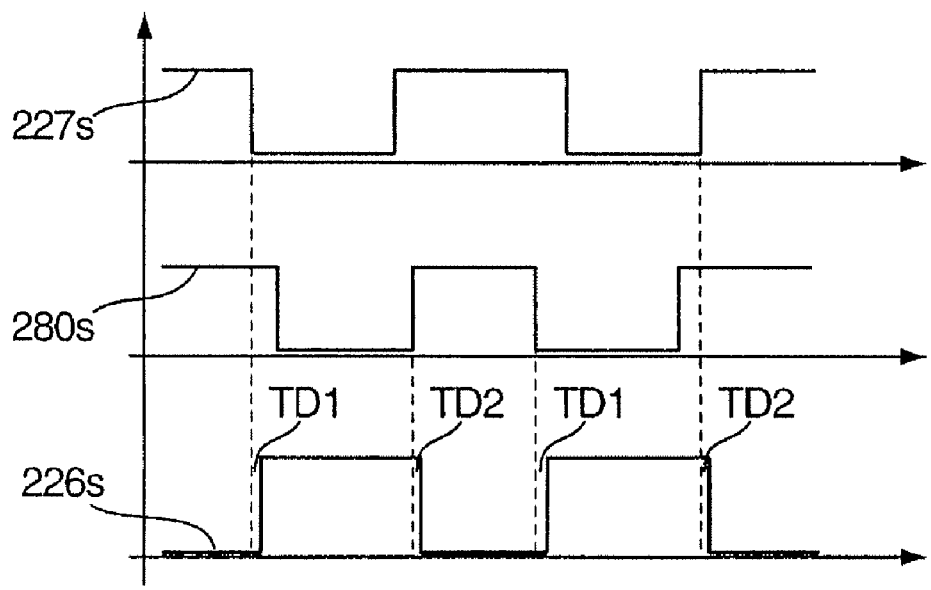
FIGS. 10A-10D are plots illustrating output signals of an arc diverter control section for different operations evaluating an arc detection signal and an input device signal.

Referring to FIG. 10A, a signal 227s from the arc detection section 227 and a signal 280s from the input device 280 can control an output signal 226s of the arc diverter control section 226 that drives the arc diverter 260. The signals 227s and 226s can be "active low" signals, which are active at a low level (active state) and inactive at a high level (inactive state). If the signals 227s and 226s are connected with the functionality of a NAND gate, the arc diverter is activated when one of the signals 227s or 280s is active. The corresponding output signal 226s of the arc diverter control section 226 is shown in FIG. 10A as an "active high" signal, which is active ant a high level and inactive at a low level of the signal. Thus, Additionally, a user configurable or automatic changeable time delay TD1 can exist between the beginning of an active state of the signals 227s and 226s and the reaction of the signal 226s. Similarly, a user configurable or automatic changeable time delay TD2 can exist between the beginning of an inactive state of the signals 227s and 226s and the reaction of the signal 226s.

Figure 10B:
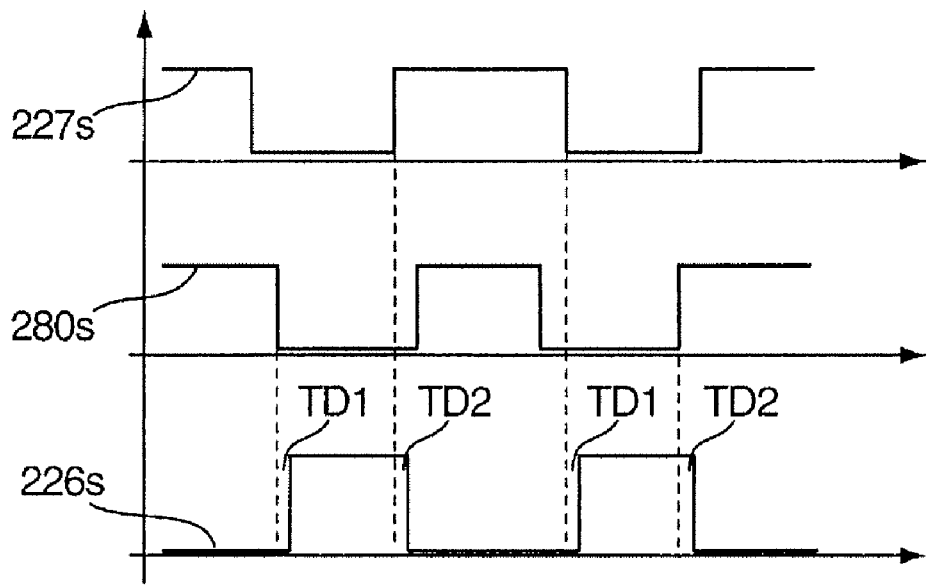

Referring to FIG. 10B, the signal 227s from the arc detection section 227 and the signal 280s from input device 280 are "active low" signals. If the signals 227s and 280s are connected with the functionality of a NOR gate, the arc diverter is activated only if both of the signals 227s and 280s are in an active state. The output signal 226s of the arc diverter control section 226, which drives the arc diverter 260, is shown in FIG. 10B. As in the previous cases, a user configurable or automatic changeable time delay TD1 might exist between the active state of 227s and 280s and the reaction of the signal 226s and a user configurable or automatic changeable time delay TD2 might exist between the inactive state of 227s or 280s and the reaction of the signal 226s.

Figure 10C:
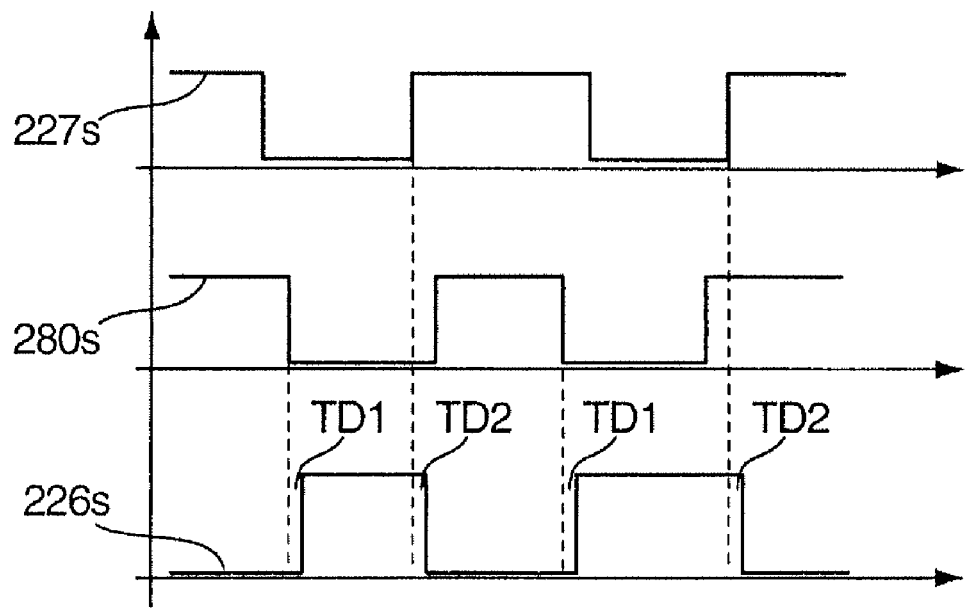

Referring to FIG. 10C, the signal 227s from the arc detection section 227 and the signal 280s from input device 280 are "active low" signals. If the signals 227s and 280s are connected with the functionality of a set and reset, the arc diverter is activated after the signal 280s changes into an active state and is deactivated after the signal 227s changes into an inactive state. The output signal 226s of the arc diverter control section 226 is shown in FIG. 10C. As in the previous cases, there might exist a user configurable or automatic changeable time delay TD1 between the active state of the signal 227s and the signal 280s and the reaction of the signal 226s and a user configurable or automatic changeable time delay TD2 between the inactive state of the signal 227s or the signal 280s and the reaction of the signal 226s.

Figure 10D:
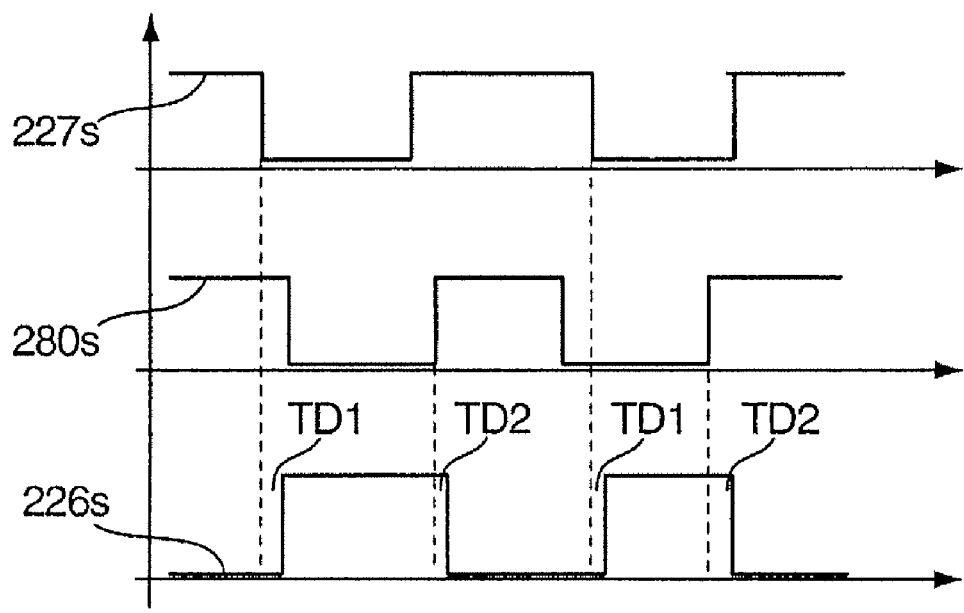

Referring to FIG. 10D, the signal 227s from the arc detection section 227 and the signal 280s from input device 280 are "active low" signals. If they are connected with the functionality of a set and reset in the opposite way as in FIG. 10C, the arc diverter is activated after the signal 227s has changed inot an active state and is deactivated after 280s has changed in an inactive state. The output signal 226s of the arc diverter control section 226 is shown in FIG. 10D. Also in this case, a user configurable or automatic changeable time delay TD1 and/or a user configurable or automatic changeable time delay TD2 can exist.

Other possibilities of functionality include AND, OR, EXOR gates. Also the status itself (low or active) of one of the signals 227s, 280s can be taken into consideration for the reaction of the signal 226s.

Figure 11:
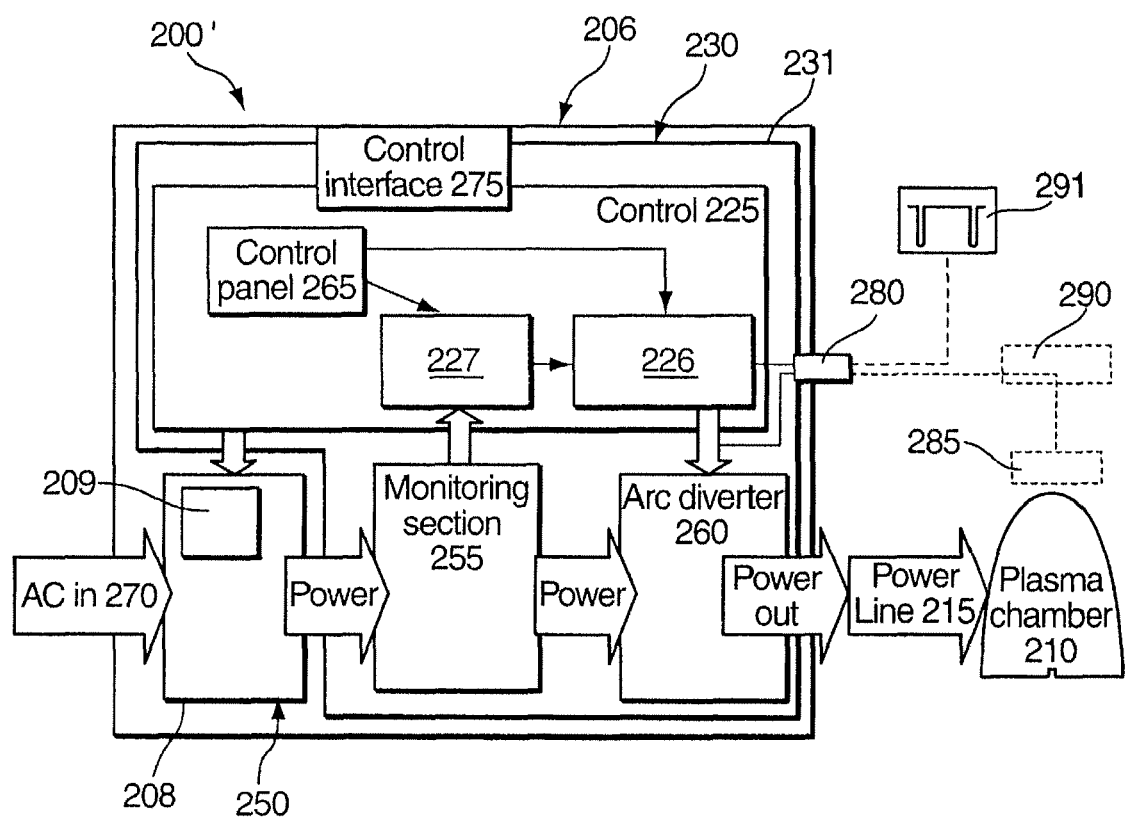
FIG. 11 is a block diagram of a forth example of plasma processing system.

FIG. 11 shows a plasma processing system 200' with a power supply system 206. The power supply system 206 includes an arc diverter system 230 and, for supplying plasma with power, a power converter 250 in a separate housing 208. The power converter 250 can have its own control section 209. The arc diverter system 230 can include a housing 231 enclosing the arc diverter 260, the monitoring section 255, and the control section 225. The input device 280 can be mounted on an exterior surface of the arc diverter system 230. Thus, the power converter (being the power supply) can be embedded in a larger (lower supply) system that also includes the arc detection elements and the arc diverter.

A number of embodiments of the invention have been described. Nevertheless, it will be understood that various modifications may be made without departing from the spirit and scope of the invention. Accordingly, other embodiments are within the scope of the following claims.

What is claimed is:

1. A plasma power supply system for producing electrical power in the range between 1 kW and 100 kW for a plasma processing system and supplying the power to a plasma chamber through a power line connection, the plasma power supply system comprising
    a power converter,
    a monitoring section,
    an arc diverter,
    a control section with an arc diverter control section and an arc detection section, and
    an input device, wherein the input device is connected to the arc diverter and configured to detect a wave shape of a signal received by the input device and to control the arc diverter to produce a pulse wave shape at the output of the power supply system, wherein the pulse wave shape is proportional or corresponds to the signal at the input device.

2. The plasma power supply system of claim 1, wherein the input device is directly connected to the arc diverter.

3. The plasma power supply system of claim 1, wherein the input device is connected to the arc diverter through a connection with the arc diverter control section.

4. The plasma power supply system of claim 1, wherein the input device is a digital input.

5. The plasma power supply system of claim 1, wherein the input device is an analog input.

6. The plasma power supply system of claim 1, wherein the input device is compatible with a cordless transmission system.

7. The plasma power supply system of claim 1, wherein the input device is connected to a sensor device, which is remote from the plasma power supply system.

8. The plasma power supply system of claim 1, wherein the input device is configured to determine a length of an input pulse received by the input device and to output a signal with the same or corresponding length to the arc diverter.

9. The plasma power supply system of claim 1, wherein the arc diverter control section receives a first signal from the input device and a second signal from the arc detection section, and wherein the arc diverter control section generates a signal to drive the arc diverter by combining the first and second signals according to one or more operations including a NOR, a NAND, a Set/Reset, an OR, an AND, and an EXOR operation.

10. The plasma power supply system of claim 9, wherein the arc diverter control section is configured to activate an arc diverter control signal with a configurable time delay after one of the operations has changed to true.

11. The plasma power supply system according to claim 9, wherein the arc diverter control section is configured to deactivate an arc diverter control signal with a configurable time delay after one of the operations has changed to false.

12. The plasma power supply system of claim 1, wherein the input device comprises an IN/OUT connection, which has an input and output.

13. The plasma power supply system of claim 1, wherein the power controller is coupled to the monitoring section to monitor an output power of the power converter.

14. The plasma power supply system of claim 1, wherein the power controller is coupled to the arc diverter for diverting the output power of the power controller to control arcing.

15. The plasma power supply system of claim 1, wherein the control section is coupled to the power controller, the monitoring section, and the arc diverter.

16. A plasma processing system comprising:
    a plasma chamber for containing an object to be processed; and
    a power supply system that delivers power to the plasma chamber, the power supply system comprising:
    a power converter that converts power for delivery to the plasma chamber;
    an arc diverter coupling the power converter to the plasma chamber, the arc diverter operable through an arc diverter control line to inhibit flow of energy from the power converter into the plasma chamber, and
    an arc diverter control input device accessible from outside the power supply system and in electrical communication with the arc diverter control line, enabling the arc diverter to be controlled from outside the power supply system.

17. The plasma processing system of claim 16, wherein the arc diverter control input device is in electrical communication with the arc diverter.

18. The plasma processing system of claim 16, wherein the arc diverter control input device is in electrical communication with a control of the arc diverter.

19. The plasma processing system of claim 16, wherein the arc diverter control input device is coupled to an arc sensor at the plasma chamber.

20. The plasma processing system of claim 19, wherein the arc sensor is remote from the power supply system.

21. The plasma processing system of claim 16, wherein the arc diverter control input device includes a switch.

22. The plasma processing system of claim 16, wherein the power supply system further comprises:
    a power converter output monitor that monitors characteristics of the converted power and generates a signal based on the monitored characteristics; and an arc diverter controller that controls the arc diverter in response to the signal from the monitor.

23. The plasma processing system of claim 22 wherein the arc diverter controller is configured to control the arc diverter to inhibit power to the plasma chamber independently of any input through the arc diverter control input device.

24. The plasma processing system of claim 22, further comprising an interface associated with the arc diverter controller to enable control of parameters associated with arc detection at the power converter output monitor.

25. The plasma processing system of claim 16, wherein the arc diverter control input device is a digital interface input connector.

26. The plasma processing system of claim 16, wherein the arc diverter control input device is configured to receive an analog control input.

27. The plasma processing system of claim 16, wherein the arc diverter is configured to generate an active signal of a duration proportional to a signal from the arc diverter control input device.

28. The plasma processing system of claim 16, further comprising an arc detection section within the power supply system.

29. The plasma processing system of claim 16, wherein the power supply system includes a housing enclosing the power converter and the arc diverter, and wherein the arc diverter control input device is mounted on an exterior surface of the power supply system housing.

30. A method of supplying power to a plasma processing chamber through a power supply, the method comprising:
    converting mains power to power conditioned to power a plasma process;
    monitoring the converted power;
    generating a monitor signal indicative of the monitored converted power;
    determining whether the generated signal indicates an occurrence of an arc within the plasma chamber;
    receiving a remote input signal from external to the power supply system indicative of an occurrence of an arc within the plasma chamber;
    inhibiting flow of converted energy from the power supply system to the plasma chamber in response to the remote input signal; and
    inhibiting flow of converted energy from the power supply system to the plasma chamber in response to determining that the generated monitor signal indicates an arc occurrence.

31. The method of claim 30, wherein inhibiting the flow of converted energy from the power supply system includes inhibiting independently of the generated monitor signal.

32. The method of claim 30, further comprising receiving the remote input signal from a sensor located at the plasma chamber, wherein the sensor measures an event at the plasma chamber.

33. The method of claim 30, wherein inhibiting the flow of converted energy to the plasma chamber includes receiving the remote input signal and determining whether an arc occurred based on the remote input signal.

34. The method of claim 30, further comprising receiving the remote input signal from a user.

35. A plasma power supply system for producing electrical power in the range between 1 kW and 100 kW for a plasma processing system and supplying the power to a plasma chamber through a power line connection, the plasma power supply system comprising
    a power converter,
    a monitoring section,
    an arc diverter,
    a control section with an arc diverter control section and an arc detection section, and
    an input device, wherein the input device is connected to the arc diverter;
    wherein the arc diverter control section receives a first signal from the input device and a second signal from the arc detection section, and wherein the arc diverter control section generates a signal to drive the arc diverter by combining the first and second signals according to one or more operations including a NOR, a NAND, a Set/Reset, an OR, an AND, and an EXOR operation.

36. The plasma power supply system of claim 35, wherein the arc diverter control section is configured to activate an arc diverter control signal with a configurable time delay after one of the operations has changed to true.

37. The plasma power supply system according to claim 35, wherein the arc diverter control section is configured to deactivate an arc diverter control signal with a configurable time delay after one of the operations has changed to false.

* * * * *

UNITED STATES PATENT AND TRADEMARK OFFICE
CERTIFICATE OF CORRECTION

| | | |
|---|---|---|
| PATENT NO. | : 7,795,817 B2 | Page 1 of 1 |
| APPLICATION NO. | : 11/944179 | |
| DATED | : September 14, 2010 | |
| INVENTOR(S) | : Moritz Nitschke | |

It is certified that error appears in the above-identified patent and that said Letters Patent is hereby corrected as shown below:

Column 1, line 7, delete "60/687,159" and insert --60/867,159--.

Signed and Sealed this
Thirty-first Day of May, 2011

David J. Kappos
*Director of the United States Patent and Trademark Office*